United States Patent [19]

Farwell

[11] Patent Number: 5,351,000
[45] Date of Patent: Sep. 27, 1994

[54] METHOD OF CANCELLING OFFSET ERRORS IN PHASE DETECTORS

[75] Inventor: William D. Farwell, Thousand Oaks, Calif.

[73] Assignee: Hughes Aircraft Company, Los Angeles, Calif.

[21] Appl. No.: 99,886

[22] Filed: Jul. 30, 1993

[51] Int. Cl.$^5$ ............................................. G01R 19/00
[52] U.S. Cl. ............................ 324/76.77; 324/601; 324/76.79; 328/133; 328/155; 328/55
[58] Field of Search ............ 324/76.79, 76.77, 601; 328/155, 133, 63, 55

[56] References Cited

U.S. PATENT DOCUMENTS

| | | | |
|---|---|---|---|
| 3,781,470 | 12/1973 | Horn | 328/155 |
| 4,338,569 | 7/1982 | Petrich | 328/155 |
| 4,459,543 | 7/1984 | McNeill | 324/76.79 |
| 4,495,473 | 1/1985 | Treise | 328/155 |
| 4,795,985 | 1/1989 | Gailbreath | 328/155 |
| 5,206,889 | 4/1993 | Unkrich | 328/155 |
| 5,272,729 | 12/1993 | Bechade | 328/63 |

Primary Examiner—Kenneth A. Wieder
Assistant Examiner—Jose M. Solis
Attorney, Agent, or Firm—L. A. Alkov; W. K. Denson-Low

[57] ABSTRACT

A phase detector circuit which includes a first fixed delay circuit responsive to the first input signal for producing a fixedly delayed first signal which is a replica of a first input signal and delayed relative thereto by a fixed delay, a second fixed delay circuit responsive to a second input signal for producing a fixedly delayed second signal which is a replica of the second input signal and delayed relative thereto by the fixed delay, a controlled delay circuit responsive to the second input signal for producing a controllably delayed second signal and delayed relative thereto by a controlled delay, a first phase detector responsive to the fixedly delayed first signal and the adjustably delayed second signal for providing a first phase detector output that comprises the output of the phase detector circuit, a second phase detector circuit responsive to the fixedly delayed second signal and the adjustably delayed second signal for providing a second phase detector output, and an integrator responsive to the addition circuit output for controlling the controlled delay circuit to set the controlled delay such that the second phase detector output indicates zero phase error, whereby the controlled delay compensates the offset error of the first phase detector.

3 Claims, 1 Drawing Sheet

METHOD OF CANCELLING OFFSET ERRORS IN PHASE DETECTORS

GOVERNMENT RIGHTS

This invention was made with Government support under Contract F33657-91-C-0006 (LASC P.O. RK787) awarded by the Department of the Air Force. The Government has certain rights in this invention.

BACKGROUND OF THE INVENTION

The subject invention is directed generally to phase detectors, and more particularly to circuitry for cancelling the offset error of a phase detector.

A phase detector provides an output that is indicative of the phase between two input signals, and is commonly implemented in phase locked loops and other phase tracking circuits. A phase detector typically has an offset error wherein a phase detector output indicates zero phase while in fact the signals being compared are not in phase. Various techniques for correcting phase detector offset error have been designed, but none of such techniques are applicable to a broad range of phase detector designs, and none of such techniques maintain cancellation over variations due to integrated circuit processing, operating conditions, and aging.

SUMMARY OF THE INVENTION

It would therefore be an advantage to provide a phase detector offset error correction circuit that is applicable to a wide range of phase detector designs.

Another advantage would be to provide a phase detector offset correction circuit that is applicable to a wide range of phase detector designs and maintains cancellation over variations due to integrated circuit processing, operating conditions, and aging.

The foregoing and other advantages are provided by the invention in a phase detector circuit for phase comparing first and second input signals, which includes a first fixed delay circuit responsive to the first input signal for producing a fixedly delayed first signal which is a replica of the first input signal and delayed relative thereto by a fixed delay, a second fixed delay circuit responsive to the second input signal for producing a fixedly delayed second signal which is a replica of the second input signal and delayed relative thereto by the fixed delay, a controlled delay circuit responsive to the second input signal for producing a controllably delayed second signal and delayed relative thereto by a controlled delay, a first phase detector responsive to the fixedly delayed first signal and the adjustably delayed second signal for providing a first phase detector output that comprises the output of the phase detector circuit, a second phase detector circuit responsive to the fixedly delayed second signal and the adjustably delayed second signal for providing a second phase detector output, and an integrator responsive to the addition circuit output for controlling the controlled delay circuit to set the controlled delay such that the second phase detector output indicates zero phase error, whereby the controlled delay compensates the offset error of the first phase detector.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
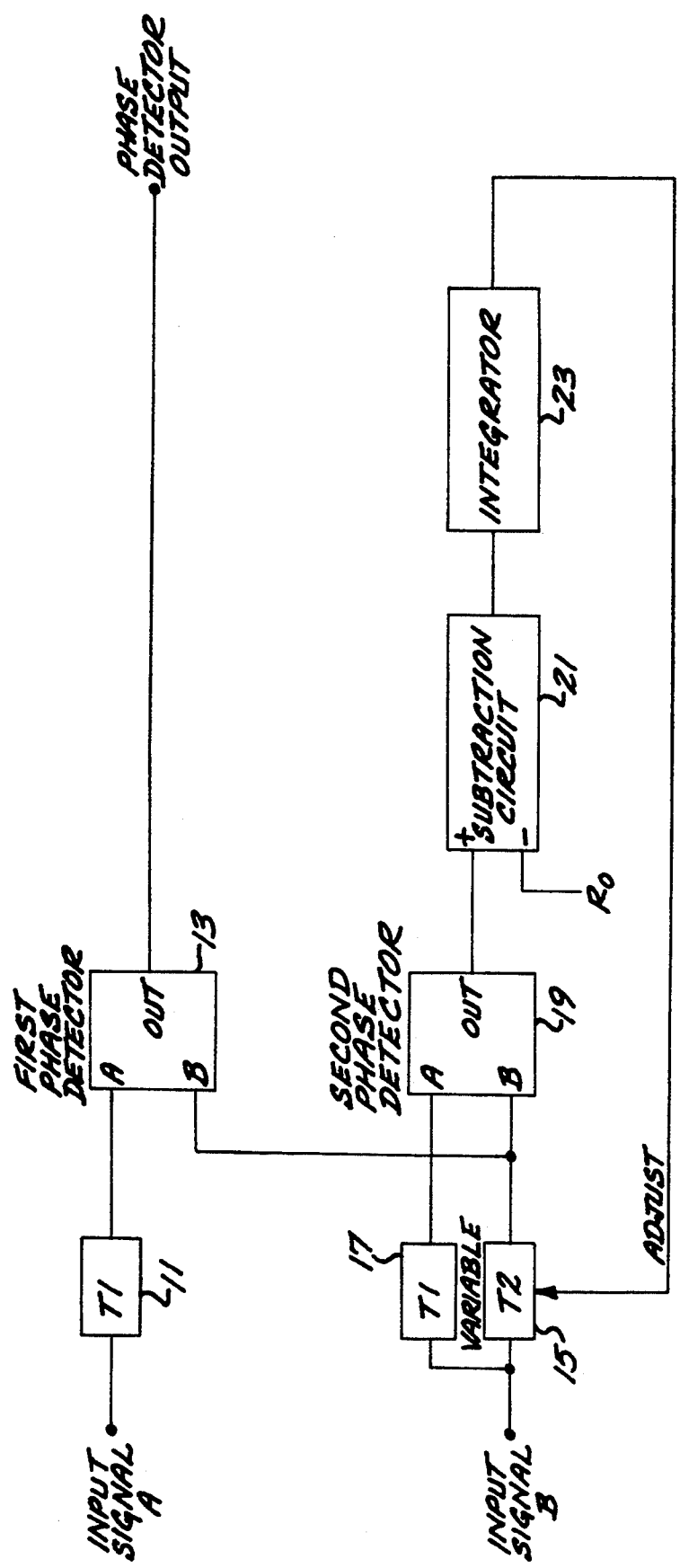
FIG. 1 is a schematic block diagram of a phase detector circuit that includes offset error correcting circuitry in accordance with the invention.

In the following detailed description and in the several figures of the drawing, like elements are identified with like reference numerals.

Referring now to FIG. 1, set forth therein is a schematic block diagram of an offset compensating phase detector circuit in accordance with the invention. The phase detector circuit includes a first fixed delay circuit 11 which receives an input signal A, which is one of the signals A and B being phase compared, and provides a fixed delay of T1 to produce a fixedly delayed signal $A_d$. The delayed signal $A_d$ is a delayed replica of the input signal A, and is provided to an A input of a first phase detector 13. An adjustable delay circuit 15 receives an input signal B, which is the other of the two signals A and B being phase compared, and provides an adjustable delay T2 to produced an adjustably delayed signal $B_{ad}$. The adjustably delayed signal $B_{ad}$ is a delayed replica of the input signal B, and is provided to a B input of the phase detector 13. The output of the phase detector 13 represents the phase error between the fixedly delayed signal $B_d$ and the adjustably delayed signal $B_{ad}$ as offset by the offset error of the first phase detector 13 wherein the delay T2 is adjusted to compensate for the offset error of the first phase detector 13 such that the output of the phase detector represents the true phase error between the input signals A and B.

The circuitry for controlling the adjustable delay circuit 15 includes a second fixed delay circuit 17 which receives the input signal B and provides a fixed delay of T1 (the same as the delay provided by the first fixed delay circuit 11) to produce a fixedly delayed signal $B_d$. The fixedly delayed signal $B_d$ is a delayed replica of the input signal B, and is provided to an A input of a second phase detector 19 which is configured to have substantially the same offset error as the first phase detector 13, and substantially the same process, temperature, and voltage factors as the first phase detector 13. For example, the second phase detector 19 is topologically identical to the first phase detector 13 and is located adjacently thereto in the same integrated circuit. The adjustably delayed signal $B_{ad}$ is provided to a B input of the second phase detector 19 which provides an output representative of the phase between the fixedly delayed signal $B_d$ and the adjustably delayed signal $B_{ad}$ as offset by the offset error of the second phase detector 19.

The output of the second phase detector is provided to a subtraction circuit 21 which subtracts the value of a reference signal $R_o$ from the output of the second phase detector and provides the difference voltage to an integrator 23. The value of the reference signal $R_o$ is equal to the output of the second phase detector that indicates zero phase error, such that the output of the subtraction circuit 21 is zero when the second phase detector indicates zero phase error. For example, if the first and second phase detectors provide analog outputs, the reference signal $R_o$ can comprise a voltage or current, as appropriate, and the subtraction circuit 21 and the integrator 23 can comprise analog circuits. If the first and second phase detectors provide digital outputs, the reference signal $R_o$ comprises a digital signal, for example, and the subtraction circuit 21 and the integrator 23 can comprise digital circuits. If the first and second phase detectors are configured so as to produce a zero output to indicate zero phase error, then the substraction circuit can be omitted. The output of the integrator 23 is fed back to the adjustable delay circuit 15 which adjusts the variable delay T2 in accordance with the signal received from the integrator.

The second phase detector, the subtraction circuit 21, the integrator, and the adjustable delay circuit comprise a negative feedback phase locked network that adjusts the variable delay T2 such that the output of the second phase detector indicates zero phase error. The inputs to the second phase detector are delayed versions of the input signal B, and the adjustable delay T2 is continually adjusted pursuant to the output of the integrating filter to the delay amount that results in the output of the second phase detector indicating zero phase error. At equilibrium, the difference between the fixed delay T1 and the adjustable delay T2 is equal to the delay between inputs to the A and B inputs of the second phase detector that produces an output indication of zero phase, and accordingly such difference represents the offset error of the second phase comparator. Since the first phase detector and the second phase detector are topologically identical and adjacently located on an integrated circuit, their offset errors are substantially the same, and the delay difference maintained for the second phase detector is precisely what is need to compensate the first phase detector.

In particular, if the offset error is such that the first phase detector indicates the signal B as leading the signal A when the actual phase error is zero, the adjustable delay T2 is adjusted to be greater than the fixed delay T1 such that the signal $B_{ad}$ is delayed relative to the signal $A_d$ by an amount that is equal to the amount of the offset error. If the offset error is such that the first phase detector indicates the signal B as lagging the signal A when the actual phase error is zero, the adjustable delay T2 is adjusted to be less than the fixed delay T1 such that the signal $B_{ad}$ is advanced by an amount that is equal to the amount of the offset error.

Effectively, the signals $A_d$ and $B_{ad}$ are forced to be out of phase by an amount that is equal and opposite to the phase error of the first and second phase detectors. If phase error is expressed in terms of one signal erroneously leading the other, the signal representing the erroneously leading signal is delayed relative to the other signal. If phase error is expressed in terms of one signal erroneously lagging the other, the signal representing the erroneously lagging signal is advanced relative to the other signal.

For the particular illustrative implementation wherein the output of the second phase detector indicates that $B_{ad}$ leads $B_d$ by an output that is greater than the reference signal $R_o$ and wherein the variable delay circuit increases delay with an increase in the output of the integrator 23, the phase locked network operates as follows. If the second phase detector indicates that $B_{ad}$ leads $B_d$, the output of the second phase detector will be greater than the reference signal $R_o$, and the input to the integrator will be positive. The integrator output thus increases, which forces the adjustable delay circuit to increase the variable delay T2, which reduces the phase error output of the second phase detector. When the variable delay T2 is sufficient such that the output of the second phase detector indicates zero phase error, the integrator output remains constant, thereby maintaining the value of the variable delay T2 which cancels the offset error in the first phase detector. Conversely, if the phase error output of the second phase detector indicates $B_{ad}$ lags $B_d$, the output of the second phase detector will be less than the reference signal $R_o$, and the input to the integrator will be negative. The integrator output thus decreases, which forces the adjustable delay circuit to decrease the variable delay T2, which reduces the phase error output of the second phase detector. When the variable delay T2 is sufficient such that the output of the second phase detector indicates zero phase error, the integrator output remains constant, thereby maintaining the value of the variable delay T2 which cancels the offset error in the first phase detector.

The foregoing has been a disclosure of offset cancelling circuitry that is advantageously utilized with a variety phase detectors and advantageously maintains phase error cancellation over variations due to integrated circuit processing, operating conditions, and aging.

Although the foregoing has been a description and illustration of specific embodiments of the invention, various modifications and changes thereto can be made by persons skilled in the art without departing from the scope and spirit of the invention as defined by the following claims.

What is claimed is:

1. A phase detector circuit for comparing the phase of first and second input signals, comprising:
   first fixed delay means responsive to the first input signal for producing a fixedly delayed first signal which is a replica of the first input signal and delayed relative thereto by a fixed delay;
   second fixed delay means responsive to the second input signal for producing a fixedly delayed second signal which is a replica of the second input signal and delayed relative thereto by the fixed delay;
   controlled delay means responsive to the second input signal for producing a controllably delayed second signal which is a replica of the second input signal and delayed relative thereto by a controlled delay;
   a first phase detector responsive to said fixedly delayed first signal and said adjustably delayed second signal for providing a first phase detector output that comprises the output of the phase detector circuit;
   a second phase detector responsive to said fixedly delayed second signal and said adjustably delayed second signal for providing a second phase detector output, said first and second phase detectors having substantially identical respective offset errors; and
   control means responsive to said second phase detector output for controlling said controlled delay means to set said controlled delay such that said second phase detector output indicates zero phase error;
   whereby said controlled delay compensates the offset error of said first phase detector.

2. The phase detector circuit of claim 1 wherein said control means comprises an integrator.

3. The phase detector circuit of claim 1 wherein said control means comprises:
   a substraction circuit for subtracting a reference signal from the output of said second phase detector to produce a substraction circuit output, wherein the reference signal has a value that is equal to a value of the second phase detector output that indicates zero phase error; and
   integrator means responsive to the subtraction circuit for producing an integrator output which controls said controlled delay means.

* * * * *